(12) United States Patent
Pakr

(10) Patent No.: US 6,656,784 B2
(45) Date of Patent: Dec. 2, 2003

(54) METHOD FOR FABRICATING CAPACITORS

(75) Inventor: Jong-Bum Pakr, Kyoungki-do (KR)

(73) Assignee: Hynix Semiconductor Inc, Kyoungki-do (KR)

( * ) Notice: Subject to any disclaimer, the term of this patent is extended or adjusted under 35 U.S.C. 154(b) by 0 days.

(21) Appl. No.: 10/315,543

(22) Filed: Dec. 10, 2002

(65) Prior Publication Data
US 2003/0139017 A1 Jul. 24, 2003

(30) Foreign Application Priority Data
Dec. 31, 2001 (KR) .......................... 2001-88733

(51) Int. Cl.[7] ................. H01L 21/8242; H01L 21/8244
(52) U.S. Cl. ....................... 438/239; 438/238
(58) Field of Search ................. 438/239, 240, 438/253, 254, 256, 238

(56) References Cited

U.S. PATENT DOCUMENTS 6,096,594 A    8/2000  Lin et al. .................. 438/238
6,284,589 B1   9/2001  Lim et al. .................. 438/240

Primary Examiner—Richard Elms
Assistant Examiner—Beth E. Owens
(74) Attorney, Agent, or Firm—Marshall, Gerstein & Borun LLP

(57) ABSTRACT

A method for fabricating a capacitor that prevents etching solution from attacking an inter-layer deposition layer in wet-etching an oxide which supports bottom electrodes. The method includes: forming a first etching barrier layer, a second etching barrier layer, and a sacrificial layer on a inter-layer deposition layer and a storage node contact; forming a concave pattern exposing the storage node contact by etching the sacrificial layer, the second etching barrier layer and the first etching barrier layer sequentially; forming a third etching barrier layer on a inner wall of the concave pattern; forming bottom electrode connected to the storage node contact in the concave pattern; removing the sacrificial layer; removing the second etching barrier layer and the third etching barrier layer selectively, and forming an anti-oxidation layer pattern by leaving the third etching barrier layer between the first etching barrier layer and the bottom electrode; and forming a dielectric layer and a top electrode on the bottom electrode sequentially.

9 Claims, 5 Drawing Sheets

METHOD FOR FABRICATING CAPACITORS

BACKGROUND

1. Technical Field

Methods for fabricating semiconductor devices are disclosed and, more particularly, methods for fabricating capacitors of semiconductor devices are disclosed.

2. Description of the Related Art

As the integration of memory devices is enhanced and higher capacitance and lower leakage current of capacitors are required, memory devices are changing from oxide-nitride-oxide (ONO) structures to metal-insulator-metal (MIM) structures.

In other words, as memory devices are integrated more and more, a high dielectric layer having a high dielectric constant, such as BLT, BST, and $Ta_2O_5$, is required, and at the same time, a metal having high work function values needs to be used as a top or bottom electrode to reduce leakage current. The metal used for an electrode of a capacitor includes Pt, Ir, Ru, and TiN.

In a semiconductor device whose cell size is less than 0.10 $\mu$m, even if a high dielectric layer is used as a dielectric layer, three-dimensional storage nodes should be formed, or a capacitor should be formed in the concave structure.

FIGS. 1A and 1B are cross-sectional views showing a conventional method for forming a capacitor. Referring to FIG. 1A, a field oxide layer is formed to separate the elements on a semiconductor substrate 11, and a junction layer 13, such as source/drain region of a transistor, is formed by injecting impurities into the active region of the semiconductor substrate 11, which is defined by the field oxide layer 12. Subsequently, an inter-layer deposition (ILD) 14 is formed on the semiconductor substrate 11.

Here, the junction layer 13 is either a p-type or a n-type conductor, and word lines, source/drain of transistors, and bit lines (not shown) are already formed prior to the formation of the ILD layer 14. The semiconductor substrate 11 may be a silicon substrate, doped silicon substrate, or an epitaxial silicon layer.

Thereafter, a photoresist is deposited on the ILD layer 14, and then patterned by performing light exposure or development. The ILD layer 14 is etched to form storage node contact holes (not shown) that expose part of the surface of the junction layer 13, using the patterned photoresist (not shown) as a mask. Here, the storage node contact hole is a contact hole where a storage node contact is to be formed to connect the junction layer 13 and the capacitor vertically.

Subsequently, a doped polysilicon layer is deposited on the ILD layer 14 in a chemical vapor deposition (CVD) method until the storage node contact holes are filled up completely, and then polysilicon plugs 15, which partially fill the storage node contact holes, are formed by performing recess etch-back.

Subsequently, a titanium layer is deposited on the entire surface of the substrate including the polysilicon plug 15 in a physical vapor deposition (PVD) method, and then a titanium silicide layer 16 is formed on the polysilicon plugs 15 by performing a thermal treatment, which induces silicide reaction between the silicon atoms of the polysilicon plugs 15 and the titanium atoms of the titanium layer.

Then, the un-reacted titanium layer is removed by performing wet-etching so as to make the titanium silicide layer 16 remain only on the polysilicon plugs 15.

Subsequently, a titanium nitride layer 17 is deposited on the ILD layer 14 until the storage node contact holes, in which the titanium silicide layer 16 is formed, are filled up completely. Then, the titanium nitride layer 17 is polished in a chemical mechanical polishing (CMP) method until the surface of the ILD layer 14 is exposed to make the titanium nitride layer 17 remain only on the titanium silicide layer 16.

According to the process described above, the storage node contact holes are filled up with storage node contacts, in which the polysilicon plug 15, titanium suicide layer 16, and titanium nitride layer 17 are deposited in order. The titanium silicide layer 16 is an ohmic contact layer to reduce contact resistance between the polysilicon plug 15 and the titanium nitride layer 17. The titanium nitride layer 17 is a barrier layer for preventing diffusion between the subsequent bottom electrode and the polysilicon plug 15.

Subsequently, an etching barrier layer 18 and an oxide 19 that determines the height and shape of the bottom electrode, to be formed subsequently, are formed on the ILD layer 14 including the titanium nitride layer 17 in order.

Here, the etching barrier layer 18 contributes to the uniform etching of the oxide 19 and thereby prevents damage on the ILD layer 14 from excessive dry etching. For this etching barrier layer 18, a nitride having an excellent etching selectivity with respect to the oxide 19, such as $Si_3N_4$, is used, and for the oxide 19, plasma enhanced-tetra ethyl ortho silicate (PE-TEOS) is used.

Thereafter, the oxide 19 is etched first using a mask (not shown) that defines the storage node on the oxide 19 so that the etching process should stop in the etching barrier layer 18, and then the etching barrier layer 18 is etched to form concave patterns (not shown) that expose the storage node contacts. This provides an electric path between the storage node contact and the bottom electrode, which will be formed later on.

Subsequently, a ruthenium layer 20 is deposited on the entire surface of the oxide 19 including the concave patterns in a CVD method, and then the ruthenium layer 20 on the oxide 19, except the ruthenium layer found in the concave patterns, is polished in a CMP method or etched back so as to make the ruthenium layer 20 remain only in the concave patterns.

Here, bottom electrodes formed of the ruthenium layer are filled in the concave patterns, and the neighboring electrodes are insulated from each other by performing CMP. Herefrom, the bottom electrodes formed of the ruthenium layer 20 are referred to as 'Ru-bottom electrodes 20.'

Referring to FIG. 1B, the oxide 19 that supports the Ru-bottom electrodes 20 is wet-etched to expose the upper part and sidewalls of the Ru-bottom electrodes 20. On the exposed Ru-bottom electrodes 20, a dielectric layer 21 and a top electrode 22 are deposited in order, and then the top electrode 22 is patterned selectively to complete the capacitor fabrication.

However, as shown in FIG. 2, in the conventional method described above, the etching barrier layer 18 and the Ru-bottom electrodes 20 do not have good adhesion to each other due to the use of diluted HF solution (A) in removing the oxide 19. Therefore, the HF solution (A) permeates into the interface between them and attacks the ILD layer 14 in the lower part of the substrate.

SUMMARY OF THE DISCLOSURE

A method for fabricating a capacitor is disclosed that can prevent etching solution from attacking an inter-layer deposition (ILD) layer, when the oxide that supports bottom electrodes is wet-etched.

A method for fabricating a capacitor is disclosed that can protect storage node contacts from being oxidized in the subsequent thermal treatment.

A disclosed method for fabricating a capacitor comprises: forming an inter-layer deposition layer on a semiconductor substrate; forming a storage node contact connected to the semiconductor substrate in the inter-layer deposition layer; forming a first etching barrier layer, a second etching barrier layer, and a sacrificial layer on the inter-layer deposition layer and the storage node contact sequentially; forming a concave pattern exposing the storage node contact by etching the sacrificial layer, the second etching barrier layer and the first etching barrier layer sequentially; forming a third etching barrier layer on a inner wall of the concave pattern; forming bottom electrode connected to the storage node contact in the concave pattern; removing the sacrificial layer; removing the second etching barrier layer and the third etching barrier layer selectively, and forming an anti-oxidation layer pattern by leaving the third etching barrier layer between the first etching barrier layer and the bottom electrode; and forming a dielectric layer and a top electrode on the bottom electrode sequentially.

DETAILED DESCRIPTION OF THE PRESENTLY PREFERRED EMBODIMENTS

FIGS. 3A through 3F are cross-sectional views showing a method for fabricating a capacitor in accordance with a disclosed method.

Figure 1A:
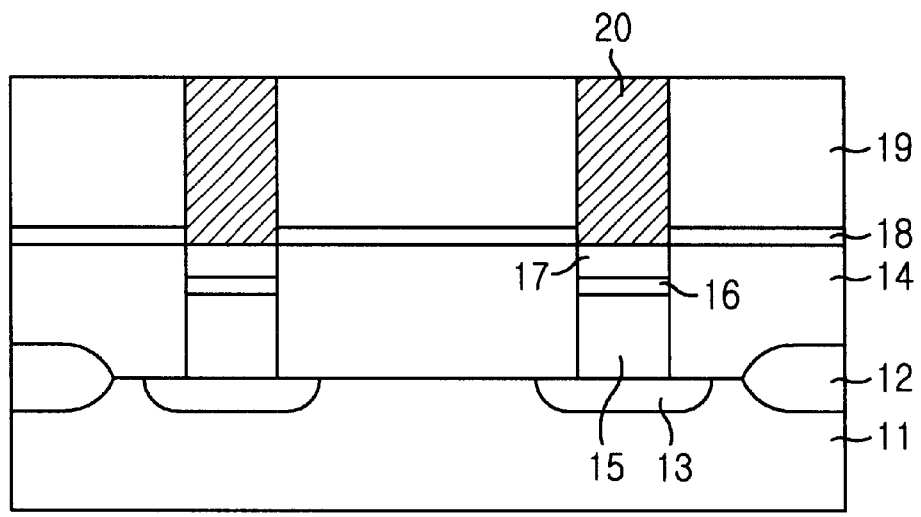
FIGS. 1A and 1B are cross-sectional views showing a method for forming a capacitor according to a prior art.
Figure 1B:
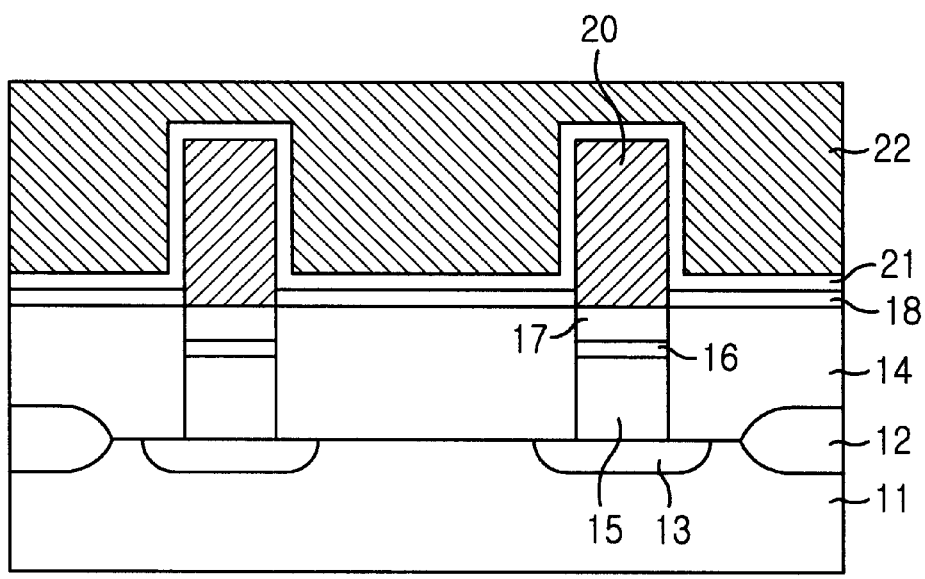
Figure 2:
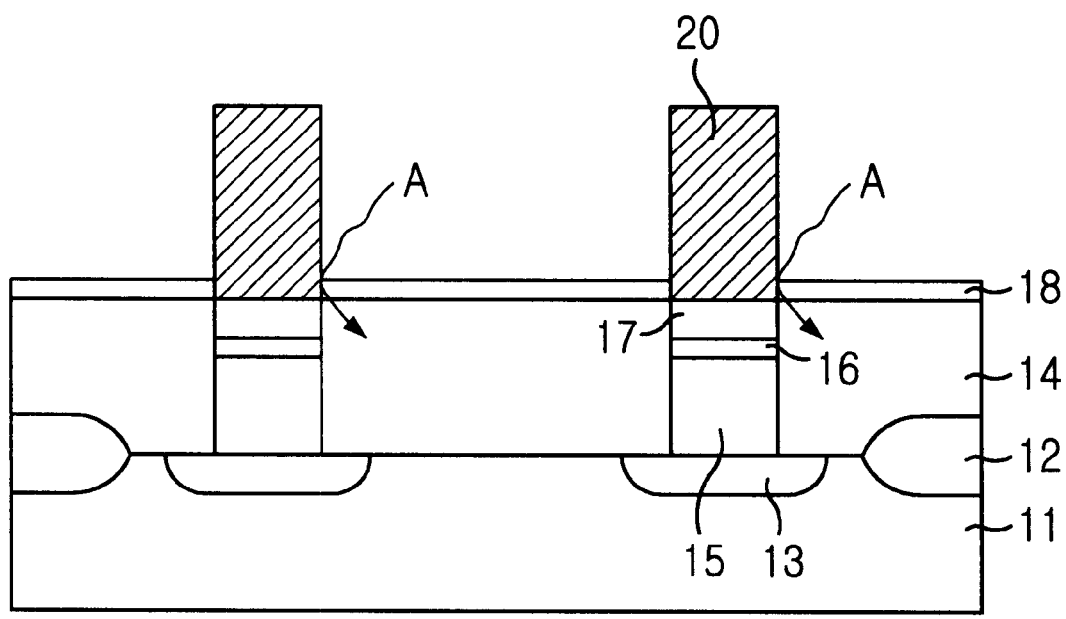
FIG. 2 is a cross-sectional view illustrating an inter-layer insulation layer being attacked according to the prior art.
Figure 3A:
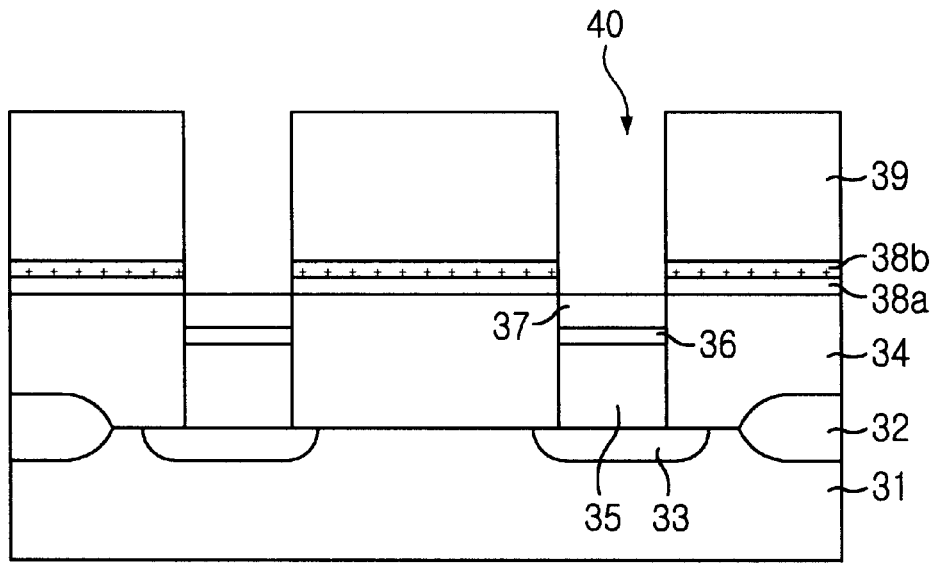
FIGS. 3A through 3F are cross-sectional views showing a method for fabricating a capacitor in accordance with an embodiment of the present invention.

As shown in FIG. 3A, a field oxide layer 32 is formed to separate elements of a semiconductor substrate 31, and a junction layer 33, such as source/drain region of a transistor, is formed by injecting impurities into the active region of the semiconductor substrate 31 which is defined by the field oxide layer 32. Then, an inter-layer deposition (ILD) layer 34 is formed on the substrate 31.

Here, the junction layer 13 is either a p-type or an n-type conductor, and word lines, source/drain of transistors, and bit lines (not shown) are already formed prior to the formation of the ILD layer 34. The semiconductor substrate 31 may be a silicon substrate, doped silicon substrate, or an epitaxial silicon layer. For the ILD layer 34, a high density plasma oxide is used.

Subsequently, a photoresist is deposited on the ILD layer 34, and then patterned by performing light exposure or development. The ILD layer 34 is etched to form storage node contact holes (not shown) that expose part of the surface of the junction layer 33, using the patterned photoresist (not shown) as a mask. Here, the storage node contact hole is a contact hole where a storage node contact is to be formed to connect the junction layer 33 and the capacitor vertically.

Subsequently, a doped polysilicon layer is deposited on the ILD layer 34 in a chemical vapor deposition (CVD) method until the storage node contact holes are filled up completely, and then polysilicon plugs 35, which partially fill the storage node contact holes, are formed by performing recess etch-back.

Thereafter, a titanium layer is deposited in a thickness ranging from about 50 to about 500 Å on the entire surface of the substrate, including the polysilicon plugs 35 by performing a physical vapor deposition (PVD), and then a titanium silicide layer 36 is formed on the polysilicon plugs 35 by performing a rapid thermal process (RTP) in an atmosphere of $N_2$ at a temperature ranging from about 500 to about 800° C. for a time period ranging from about 30 to about 120 seconds. The RTP process induces a silicide reaction between the silicon atoms of the polysilicon plugs 35 and the titanium atoms of the titanium layer.

Then, the un-reacted titanium layer is removed by performing wet-etching to make the titanium silicide layer 36 remain only on the polysilicon plugs 35.

Subsequently, a first titanium nitride layer 37 is deposited on the ILD layer 34 by performing CVD until the storage node contact holes, in which the titanium silicide layer 36 is formed, are filled up completely. Then, the first titanium nitride layer 37 is polished in a chemical mechanical polishing (CMP) method until the surface of the ILD layer 34 is exposed so as to make the first titanium nitride layer 37 remain only on the titanium silicide layer 36. The thickness of the remaining first titanium nitride layer 37 ranges from about 200 to about 1,000 Å.

According to the process described above, the storage node contact holes are filled up with storage node contacts, in which the polysilicon plug 35, titanium silicide layer 36, and the first titanium nitride layer 37 are deposited sequentially. The titanium silicide layer 36 is an ohmic contact layer to reduce contact resistance between the polysilicon plug 35 and the first titanium nitride layer 37. The first titanium nitride layer 37 is a barrier layer for preventing diffusion between the bottom electrodes, to be formed later on, and the polysilicon plugs 35.

Subsequently, a silicon nitride layer 38a, a second titanium nitride layer 38b, and an oxide 39 are deposited on the ILD layer 34 including the first titanium nitride layer 37 in order.

Here, for the silicon nitride 38a, $Si_3N_4$ is deposited with a thickness ranging from about 100 to about 1,000 Å. It works as a dry-etching barrier layer in the dry-etching of the oxide 39 and the second titanium nitride layer 38b, which are performed for subsequent process for fabricating a capacitor, and at the same time, it works as a wet-etching barrier layer as well in the wet-etching of the second titanium nitride layer 38b after the formation of bottom electrodes.

The second titanium nitride layer 38b is deposited with a thickness ranging from about 100 to about 1,500 Å by performing PVD, and it works as a dry-etching barrier layer in the subsequent process of dry-etching the oxide 39 and after the formation of bottom electrodes, it works as a wet-etching barrier layer in the process wet-etching the oxide 39.

The oxide 39 that determines the height and shape of the bottom electrodes to be formed later on, and works as a sacrificial layer which will be removed after the formation of the bottom electrodes, is deposited with a thickness ranging from about 5,000 to about 25,000 Å. Materials that can be used for the oxide 39 include undoped silicate glass (USG), phospho silicate glass (PSG), boro phospho silicate glass (BPSG), and PE-TEOS.

Subsequently, a mask (not shown) that defines the storage nodes is formed on the oxide 39, and the oxide 39 is dry-etched until the second titanium nitride layer 38b is exposed. The exposed second titanium nitride layer 38b, too, is dry-etched until the silicon nitride 38a is exposed, and then the exposed silicon nitride 38a is also dry-etched to open storage node contacts. This way, concave patterns 40 that provide an electric path between the storage node contact and the subsequent bottom electrode are formed.

Figure 3B:
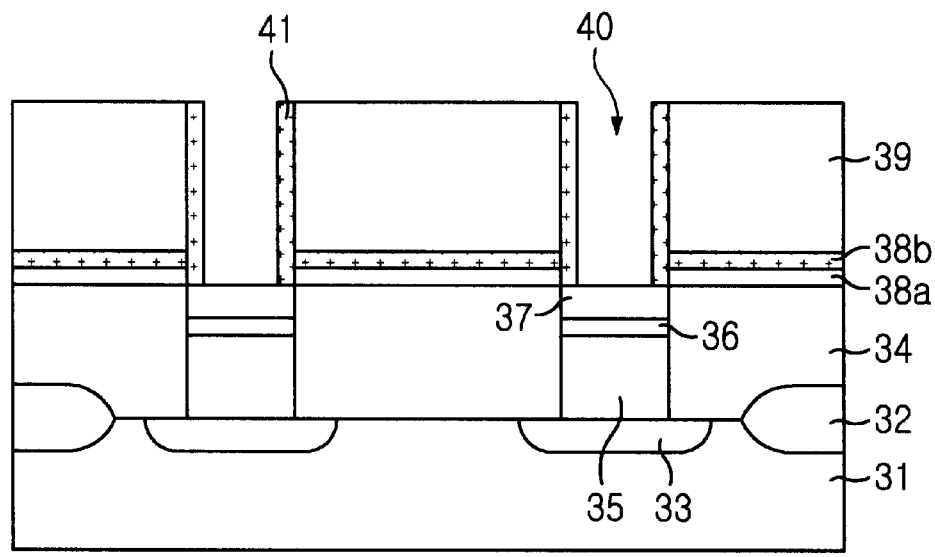

Referring to FIG. 3B, a third titanium nitride layer 41 is deposited on the entire surface of the oxide 39 including the concave patterns 40 with a thickness ranging from about 50 to about 500 Å, using a CVD method.

Subsequently, the third titanium nitride layer 41 is maintained only on the sidewalls of the concave patterns 40 by performing blanket etch-back. That is, spacers formed of the third titanium nitride layer 41 are formed on the sidewalls of the concave patterns 40.

Figure 3C:
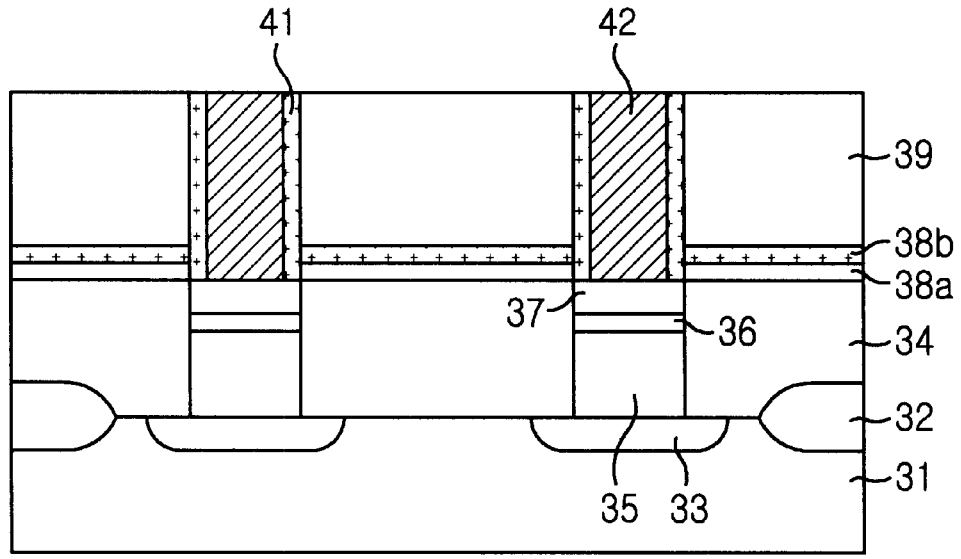

Referring to FIG. 3C, a ruthenium layer 42 is deposited on the oxide 39 in a CVD method until the concave patterns are filled up completely, and then the ruthenium layer 42 is maintained only in the concave patterns 40 by performing CMP or etch-back.

Here, the concave pattern 40 is filled with the bottom electrode, ruthenium layer 42. Herefrom, the bottom electrodes formed of the ruthenium layer 42 are referred to simply as 'Ru-bottom electrodes 42.' For the bottom electrodes, platinum (Pt) deposited in a CVD method can also be used.

Figure 3D:
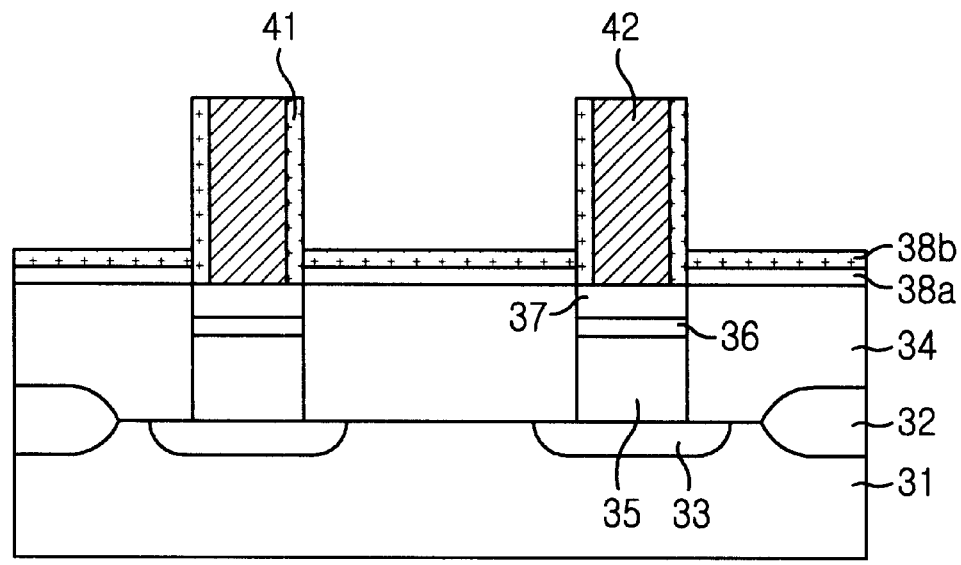

Referring to FIG. 3D, the oxide 39 that supports the Ru-bottom electrodes 42 is wet-etched. Here, the presence of the third titanium nitride layer 41 prevents the etching solution from permeating into the ILD layer 34 in the lower part of the substrate during the wet-etching using an HF solution.

After the process of wet-etching the oxide 39, the Ru-bottom electrodes 42 are supported by the second titanium nitride layer 38b and the third titanium nitride layer 41. The adhesion between the Ru-bottom electrodes 42 and the second and third titanium nitride layers 38b and 41 is larger than that of the silicon nitride 38a and the Ru-bottom electrodes 42. That is, the second and third titanium nitride layers 38b and 41 are more adhesive to the Ru-bottom electrodes 42 than the silicon nitride 38a.

Figure 3E:
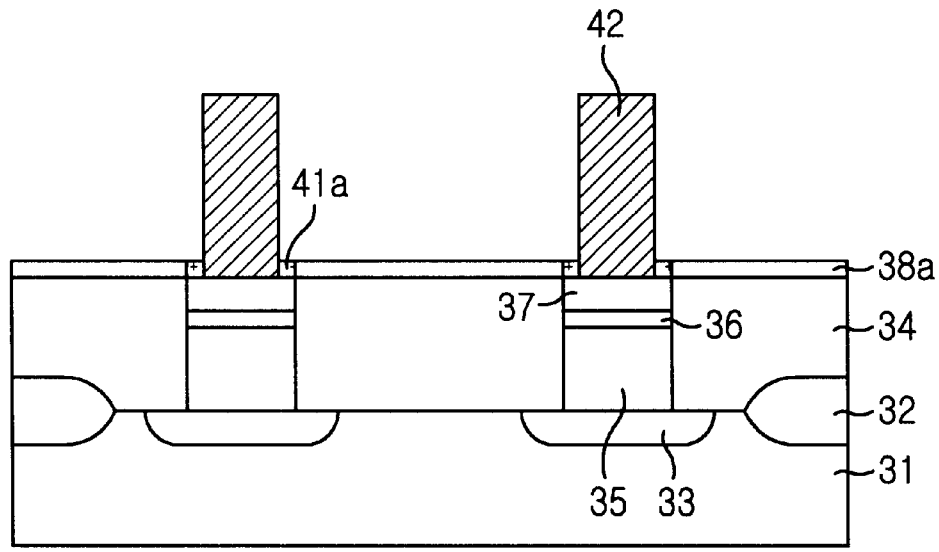

Referring to FIG. 3E, the second and third titanium nitride layers 38b and 41 are wet-etched using the selectivity of the silicon nitride 38a and the Ru-bottom electrodes 42. In this process, the composition of the etching solution includes $H_2SO_4:H_2O_2$ in a ratio of about 4:1.

Meanwhile, unless the titanium nitride layers are removed, they are oxidized into $TiO_2$ in the subsequent process of dielectric layer deposition and thermal treatment, and this causes the problem of increasing leakage current.

In the wet-etching process described above, while the second titanium nitride layer 38b is all removed, the third titanium nitride layer 41 that contacts the sidewalls of the concave patterns 40 is not removed completely, but remains in the part where the silicon nitride 38a contacts the Ru-bottom electrodes 42. Hereafter, the third titanium nitride layer 41 is referred to as an 'anti-oxidation layer' 41a.

The anti-oxidation layer, which is the remaining third titanium nitride layer, prevents the etching solution of the second and third titanium nitride layers from permeating into the ILD layer 34, and also protects the first titanium nitride layer 37 in the storage node contacts from being oxidized in the subsequent thermal process of dielectric layer which is performed in the ambient of oxygen.

Figure 3F:
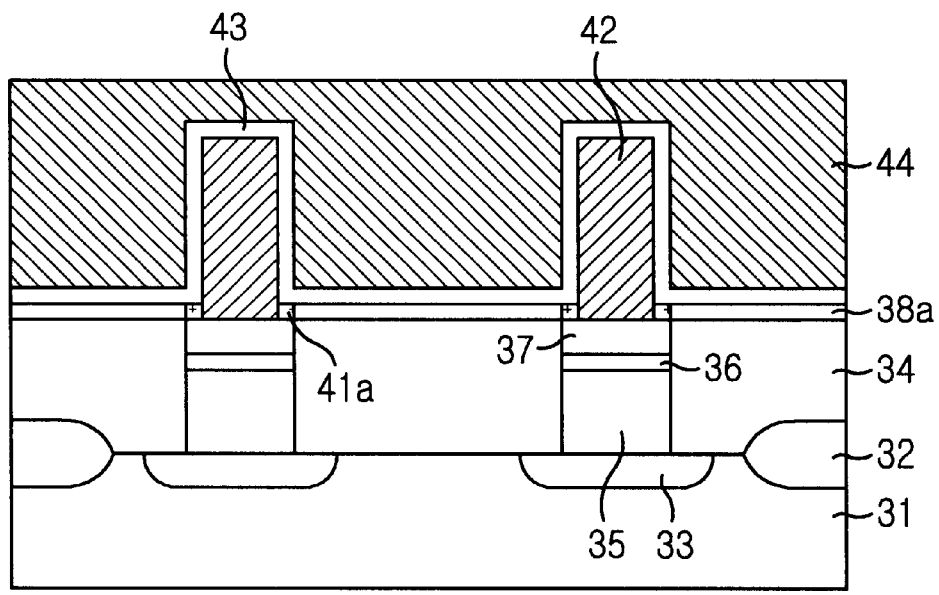

Referring to FIG. 3F, thermal treatment is performed at a temperature ranging from about 400 to about 700° C. for a time period ranging from about 30 to about 180 seconds in the ambient of nitrogen to remove impurities within the Ru-bottom electrodes 42. Subsequently, a dielectric layer 43 and a top electrode 44 are deposited sequentially on the entire surface including the Ru-bottom electrodes 42, and then the top electrode 44 is patterned selectively, thereby completing the fabrication of a capacitor.

Here, the dielectric layer 43 is formed by depositing $Ta_2O_5$ or BST in a thickness of 50~500 Å using a metal organic chemical vapor deposition (MOCVD) method. After the deposition, rapid thermal process (RTP) is performed on the dielectric layer 43 at a temperature ranging from about 500 to about 800° C. in the ambient of nitrogen to crystallize the dielectric layer and enhance its layer characteristics. Then, to supply oxygen, RTP or furnace thermal treatment is performed again in the ambient of oxygen at a temperature ranging from about 300 to about 500° C.

For the top electrode 44, a ruthenium layer or platinum layer is deposited in a CVD method. The top electrode 44 goes through a furnace thermal treatment at a temperature ranging from about 300 to about 500° C. in the ambient of nitrogen to recover the dielectric characteristics of the dielectric layer which is damaged in the patterning process of the top electrode 44.

In the above-described embodiment, the storage node contacts are formed by depositing the polysilicon plug, titanium silicide, and the first titanium nitride layer in order. However, a ruthenium (Ru) layer may be formed on top of the first titanium nitride to enhance the adhesion to the bottom electrodes, improve resistance against the subsequent wet-etching, and prevent oxidation of the titanium silicide layer and the first titanium nitride layer.

In other words, a storage node contact, in which polysilicon plug/titanium silicide layer/the first titanium nitride layer/ruthenium layer are deposited in the mentioned order, can also be formed by, after the formation of the titanium silicide layer, depositing the first titanium nitride layer on the entire surface, etching back the first titanium nitride layer and thus filling the first titanium nitride layer in the contact holes partially, depositing the ruthenium layer on the first titanium nitride layer in a CVD or PVD method, and performing CMP thereon.

This storage node contact better suppresses the oxidation of the titanium silicide layer and the first titanium nitride layer than the storage node contact of the polysilicon plug/titanium silicide layer/the first titanium nitride layer.

The method of the present invention improves throughput of capacitors by preventing etching solution from attacking the ILD layer, and enhances electric characteristics of the capacitors by suppressing the oxidation of the storage node contacts in the subsequent thermal treatment.

While the disclosed methods have been described with respect to certain preferred embodiments, it will be apparent to those skilled in the art that various changes and modifications may be made without departing from the scope of this disclosure as defined in the following claims.

What is claimed is:

1. A method for fabricating a capacitor, the method comprising:

forming an inter-layer deposition layer on a semiconductor substrate;

forming a storage node contact connected to the semiconductor substrate in the inter-layer deposition layer;

sequentially forming a first etching barrier layer, a second etching barrier layer, and a sacrificial layer on the inter-layer deposition layer and the storage node contact;

forming a concave pattern exposing the storage node contact by etching the sacrificial layer, the second etching barrier layer and the first etching barrier layer sequentially;

forming a third etching barrier layer on an inner wall of the concave pattern;

forming a bottom electrode connected to the storage node contact in the concave pattern;

removing the sacrificial layer;

removing the second etching barrier layer and the third etching barrier layer selectively, and forming an anti-oxidation layer pattern by leaving the third etching barrier layer between the first etching barrier layer and the bottom electrode; and forming a dielectric layer and a top electrode on the bottom electrode sequentially.

2. The method as recited in claim 1, wherein the first etching barrier layer is silicon nitride, and the second and third etching barrier layers are titanium nitride layers.

3. The method as recited in claim 2, wherein the step of forming the third etching barrier layer includes the steps of:

forming a titanium nitride layer on the sacrificial layer including the concave pattern; and forming the third etching barrier layer in a shape of a spacer on the inner wall of the concave pattern by applying blanket etch-back to the titanium nitride layer.

4. The method as recited in claim 1, wherein the step of forming the anti-oxidation layer is carried out with a wet-etching process using the selectivity of the first etching barrier layer and the bottom electrode.

5. The method as recited in claim 1, wherein the first etching barrier layer is formed with a thickness ranging from about 100 to about 1,500 Å.

6. The method as recited in claim 1, wherein the second etching barrier layer is formed with a thickness ranging from about 100 to about 1,500 Å using a physical vapor deposition (PVD) method.

7. The method as recited in claim 1, wherein the third etching barrier layer is formed with a thickness ranging from about 50 to about 500 Å using a chemical vapor deposition (CVD) method.

8. The method as recited in claim 1, wherein the storage node contact has a ruthenium layer at least on a part where the storage node contact contacts the bottom electrode.

9. The method as recited in claim 1, wherein the second and third etching barrier layers are formed of the same material which has a larger adhesion to the bottom electrodes than the first etching barrier layer.

* * * * *

UNITED STATES PATENT AND TRADEMARK OFFICE
CERTIFICATE OF CORRECTION

PATENT NO.    : 6,656,784 B2  
DATED         : December 2, 2003  
INVENTOR(S)   : Jong Bum Park Page 1 of 1

It is certified that error appears in the above-identified patent and that said Letters Patent is hereby corrected as shown below:

<u>Title page,</u>  
Item [12], please delete "Pakr" and replace with -- Park --.  
Item [75], Inventor, please delete "Pakr" and replace with -- Park --.

Signed and Sealed this

Thirtieth Day of March, 2004

JON W. DUDAS  
*Acting Director of the United States Patent and Trademark Office*